United States Patent
Wu et al.

(10) Patent No.: US 6,207,581 B1
(45) Date of Patent: Mar. 27, 2001

(54) METHOD OF FABRICATING NODE CONTACT HOLE

(75) Inventors: King-Lung Wu, Chia-Li Chen; Chuan-Fu Wang, Taipei, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/387,094

(22) Filed: Sep. 1, 1999

(51) Int. Cl.$^7$ .................................... H01L 21/00
(52) U.S. Cl. ................ 438/712; 438/692; 438/719; 438/723; 438/724
(58) Field of Search .................... 438/692, 712, 438/719, 723, 724, 743, 744, 626, 631, 637, 645, 672; 216/67

(56) References Cited

U.S. PATENT DOCUMENTS 6,004,883 * 12/1999 Yu et al. ........................ 438/723 X
6,080,674 * 6/2000 Wu et al. ........................ 438/723 X

* cited by examiner

*Primary Examiner*—William Powell

(57) ABSTRACT

A method of fabricating a node contact hole is disclosed. The fabrication includes the steps as follows. At first, the first interpoly dielectric (IPD1) layer is formed over the semiconductor substrate. The landing pad is formed in the first interpoly dielectric layer. The polycide bit line is formed on the first interpoly dielectric layer. Afterwards, the second interpoly dielectric (IPD2) layer is formed over the first interpoly dielectric layer. Next, the defined photoresist layer is formed on the second interpoly dielectric layer, then using reflow and curing processes to form the heated photoresist layer. Afterwards, a portion of the second interpoly dielectric layer is firstly etched, using the heated photoresist layer as a mask. The depth is formed in the second interpoly dielectric layer. Then the heated photoresist layer is removed. Next, in order to the silicon nitride layer and the polysilicon layer are deposited over the second interpoly dielectric layer. Then, the polysilicon layer is etched back to expose the silicon nitride layer. Afterwards, a portion of the second interpoly dielectric layer is secondly etched to expose the land pad. Next, in order to the polysilicon layer and the silicon nitride layer are removed over the second interpoly dielectric layer. The node contact hole is formed in the second interpoly dielectric layer.

38 Claims, 3 Drawing Sheets

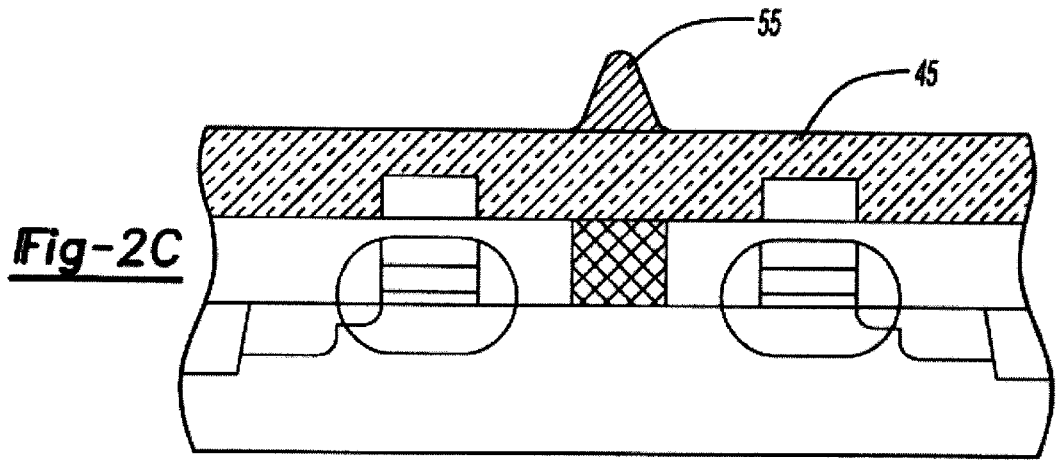
_Fig-2C_
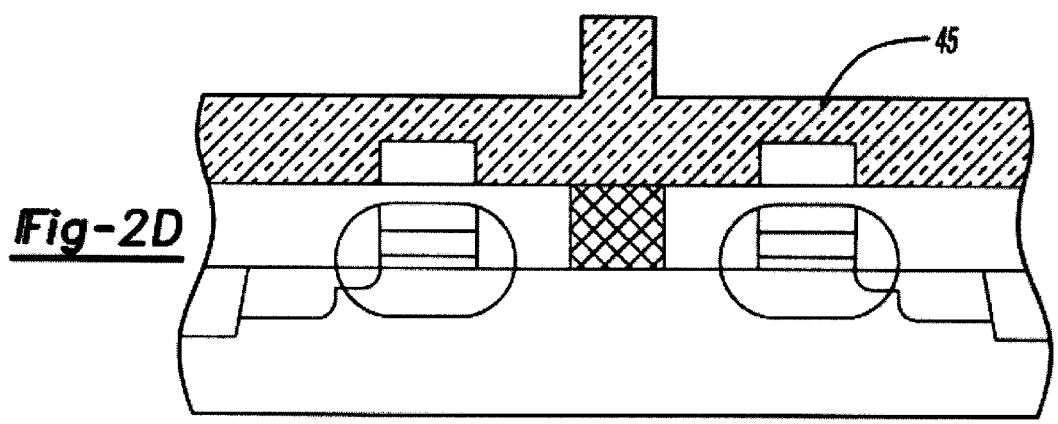
_Fig-2D_
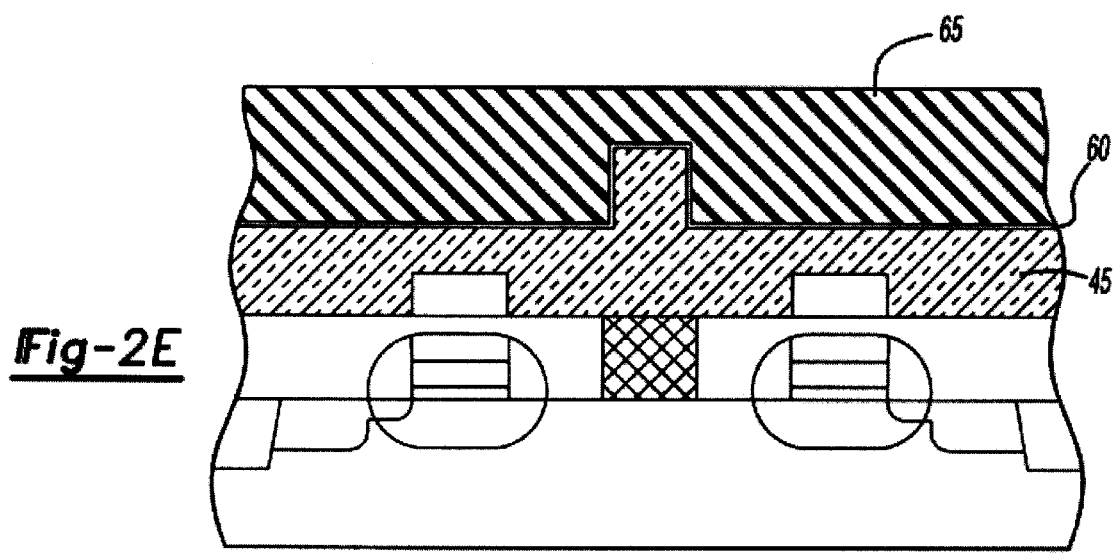
_Fig-2E_

METHOD OF FABRICATING NODE CONTACT HOLE

BACKGROUND OF THE INVENTION

1. Field of the Invention

The present invention relates to a method of fabricating a contact hole, and particularly to a method of fabricating a node contact hole.

2. Description of the Prior Art

Recently, ultra large scale integration (ULSI) semiconductor technologies have dramatically increased the integrated circuit density on the chips formed on the semiconductor substrate. This increase in circuit density has resulted from downsizing of the individual devices and the resulting increase in device packing density. The reduction in device size was achieved predominantly by recent advances in high resolution photolithography, directional (anisotropic) plasma etching, and other semiconductor technology innovations. However, future requirements for even greater circuit density is putting additional demand on the semiconductor processing technologies and on device electrical requirements.

The rapidly increasing integrated circuit in the number of cells on the DRAM chip and the corresponding reduction in physical size of the capacitor, it is becoming increasingly difficult to fabricate a node contact hole in the capacitor. FIGS. 1A and 1B shows the cross-sectional view of a traditional node contact hole. At first, the polysilicon layer 110 is formed on the interpoly dielectric layer 100. Afterwards, the trench 120 is formed in polysilicon layer 110, as shown in FIG. 1A. Next, a portion of the interpoly dielectric layer 100 is etched to expose the land pad 130, using the polysilicon layer 110 as a hard mask. Then, the polysilicon layer 110 is removed on the interpoly dielectric layer 100. Finally, the node contact hole 140 is formed in the interpoly dielectric layer 100, as shown in FIG. 1B. Due to this contact hole 140 will not obtain the linewidth of 0.1 $\mu$m. Thus, this present invention is disclosed by applying novel processes, and improving the disadvantage.

SUMMARY OF THE INVENTION

In accordance with the present invention, a method is provided for forming a node contact hole that substantially reduces linewidth. In one embodiment, the fabrication process includes the steps as follows. At first, a semiconductor structure comprises a metal-oxide-semiconductor field effect transistor (MOSFET) formed in and on the semiconductor substrate. The metal-oxide-semiconductor field effect transistor (MOSFET) includes a shadow trench isolation (STI), a thin oxide, a polycide word line, a source/drain, an oxide spacer, and a cap oxide layer, forming a metal-oxide-semiconductor field effect transistor (MOSFET). The shadow trench isolation is formed in the semiconductor substrate to surround and electrically isolate each device area. The thin oxide is formed, using thermal oxidation. The polycide word line is composed of polysilicon and tungsten silicon (WSi$_2$). The source/drain is formed, comprising the lightly doped source/drain and heavily doped source/drain. However, the oxide spacer and the cap oxide layer are formed, usually by depositing an insulating layer such as silicon nitride (Si$_3$N$_4$) and silicon oxide (SiO$_2$). Afterwards, the first interpoly dielectric (IPD1) layer is formed on a semiconductor structure. The landing pad is formed in the first interpoly dielectric layer. The polycide bit line is formed on the first interpoly dielectric layer. Next, the second interpoly dielectric (IPD2) layer is formed on the polycide bit line, the landing pad, and the first interpoly dielectric layer. The defined photoresist layer is formed on the second interpoly dielectric layer, then using reflow and curing processes to form the heated photoresist layer, the heated photoresist layer defining a node contact pattern. Afterwards, a portion of the second interpoly dielectric layer is firstly etched, using the heated photoresist layer as a mask. Thus, the depth is formed in the second interpoly dielectric layer. Then, the heated photoresist layer is removed. Next, the silicon nitride layer is deposited on the second interpoly dielectric layer. The polysilicon layer is deposited on the silicon nitride layer. Afterwards, the polysilicon layer is etched back to expose the silicon nitride layer. A portion of the second interpoly dielectric layer is secondly etched to expose the land pad, using the polysilicon layer as a hard mask. Next, the polysilicon layer is removed on the silicon nitride layer. The silicon nitride layer is removed on the second interpoly dielectric layer. Finally, the node contact hole is formed in the second interpoly dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A through 2H shows the cross-sectional views illustrative of various stages in the node contact hole in accordance with one embodiment of the present invention.

DESCRIPTION OF THE PREFERRED EMBODIMENT

A method of fabricating a node contact hole will now be described in detail. Referring to FIGS. 2A through 2H shows the cross-sectional views illustrative of various stages in the node contact hole in accordance with one embodiment of the present invention.

Figure 1A:
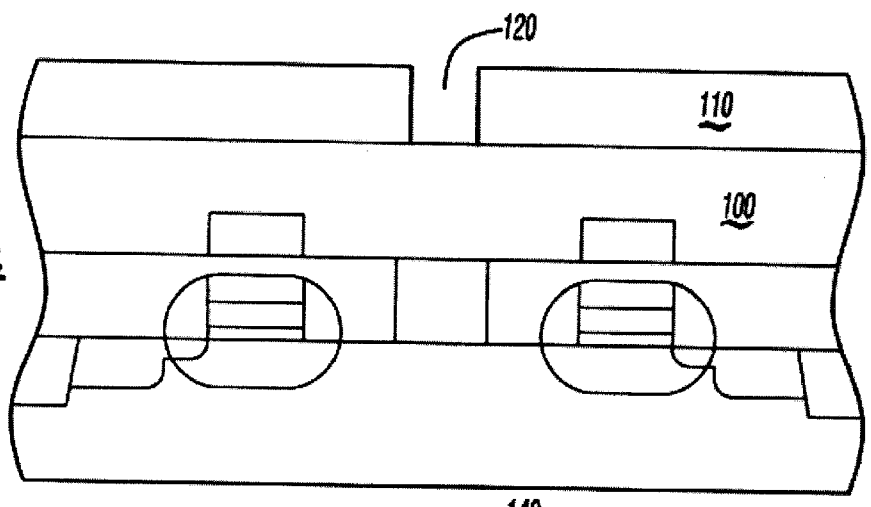
FIGS. 1A and 1B shows the cross-sectional view of a traditional node contact hole.
Figure 1B:
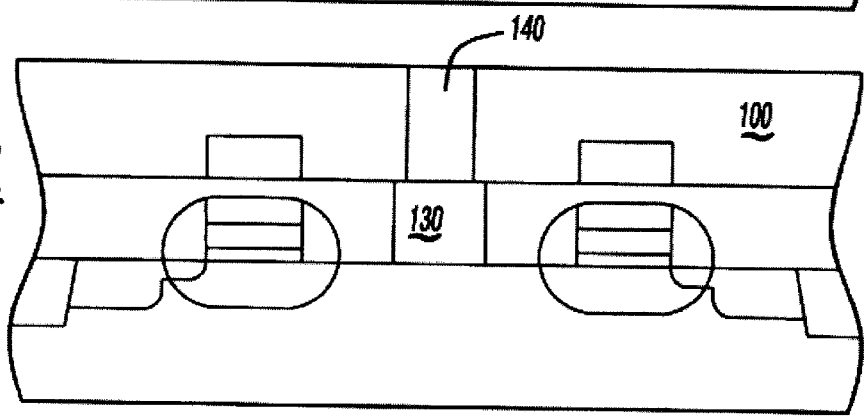
Figure 2A:
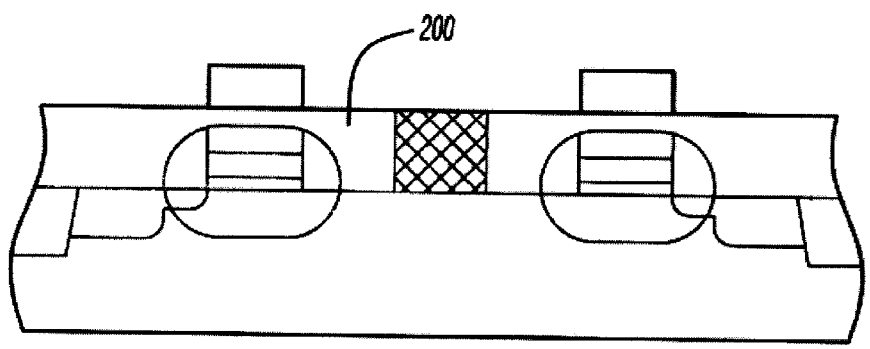

Referring to FIG. 2A, the semiconductor structure 200 comprises a metal-oxide-semiconductor field effect transistor (MOSFET) formed in and on the semiconductor substrate 10. The metal-oxide-semiconductor field effect transistor (MOSFET) includes a shadow trench isolation (STI) 15, a thin oxide 27, a polycide word line 25, a source/drain 20, an oxide spacer 26, and a cap oxide layer 28. The shadow trench isolation 20 is formed in the semiconductor substrate 10 to surround and electrically isolate each device area. The thin oxide 27 is formed, using thermal oxidation procedures. However, the polycide word line 25 is composed of polysilicon and tungsten silicon (WSi$_2$). The source/drain 20 is formed, comprising the lightly doped source/drain 17 and heavily doped source/drain 18. Moreover, the oxide spacer 26 and the cap oxide layer 28 are formed, usually by depositing an insulating layer such as silicon nitride (Si$_3$N$_4$) and silicon oxide (SiO$_2$). Afterwards, the first interpoly dielectric (IPD1) layer 30 is formed, using low pressure chemical vapor deposition (LPCVD) procedures and tetraethylorthosilicate (TEOS) as a source, at a temperature between about 500.degree. to 800.degree. C., to a thickness between about 1000 to 3000 angstroms, on a semiconductor structure 200. The landing pad 35 is formed to use as the polysilicon plug in the first interpoly dielectric layer 30. Next, the polycide bit line 40 is formed, including polysilicon and tungsten silicon (WSi$_2$), on the first interpoly dielectric layer 30.

Figure 2B:
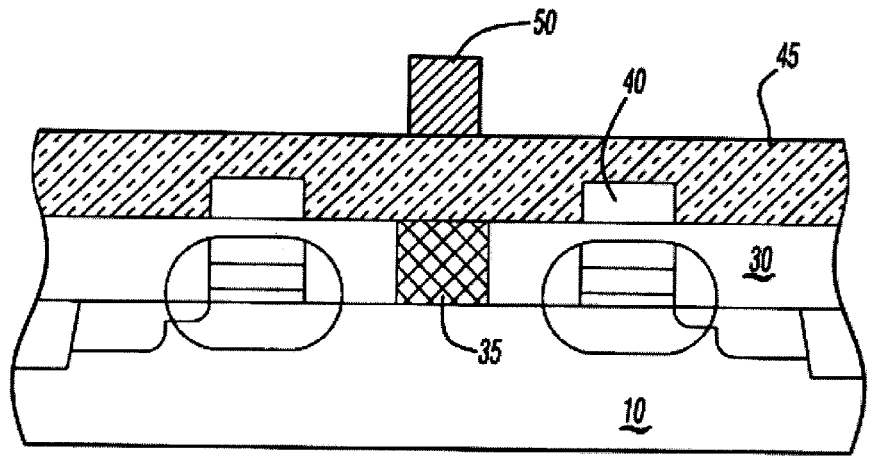

Referring to FIGS. 2B and 2C, the second interpoly dielectric (IPD2) layer 45 is formed, using low pressure chemical vapor deposition (LPCVD) procedures and TEOS as a source, at a temperature between about 500.degree. to 800.degree. C., to a thickness about 6000 angstroms, on the polycide bit line 40, the landing pad 35, and the first interpoly dielectric layer 30. The defined photoresist layer 50 is formed, using conventional photolithography techniques, on the second interpoly dielectric layer 45, as shown in FIG. 2B. Then, the defined photoresist layer 50 is used reflow and curing processes to form the heated photoresist layer 55, as shown in FIG. 2C, the heated photoresist layer 55 defining a node contact pattern.

Referring to FIG. 2D, a portion of the second interpoly dielectric layer 45 is firstly etched, using the heated photoresist layer 55 as a mask. However, the firstly etching is carried out reactive ion etch (RIE) with $C_4F_8$, CO, and $O_2$ as an etchant gas mixture. Next, the depth is formed about 0.2 μm in the second interpoly dielectric layer 45. Then, the heated photoresist layer 55 is removed.

Figure 2F:
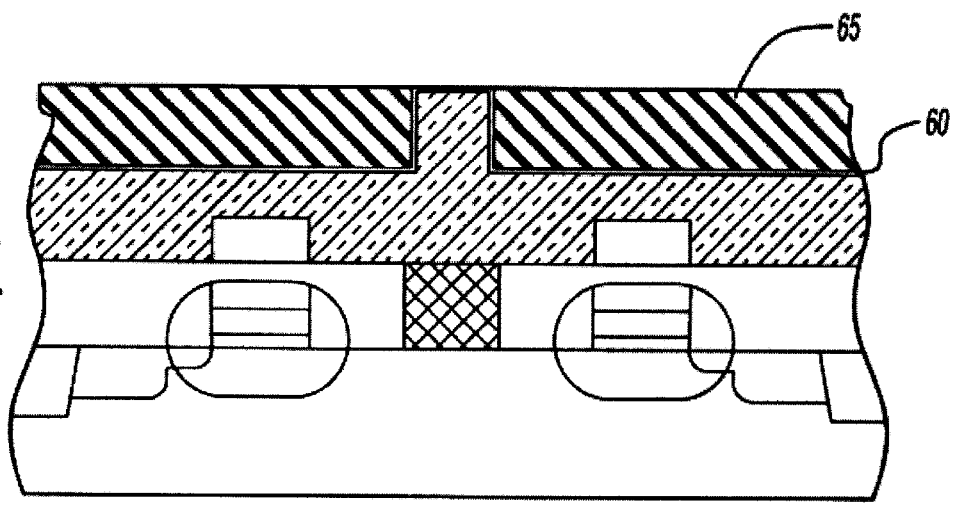

Referring to FIGS. 2E and 2F, the silicon nitride layer 60 is deposited, using LPCVD procedures, at a temperature about 750.degree. C., to a thickness about 86 angstroms, on the second interpoly dielectric layer 45. Afterwards, the polysilicon layer 65 is deposited, using LPCVD procedures and silane ($SiH_4$) as a source, at a temperature between about 600.degree. to 650.degree. C., to a thickness about 3000 angstroms, on the silicon nitride layer 60, as shown in FIG. 2E. Next, the polysilicon layer 65 is etched back, using reactive ion etch (RIE) with $Cl_2$ as an etchant or chemical mechanical polishing (CMP) to expose the silicon nitride layer 60, as shown in FIG. 2F.

Figure 2G:
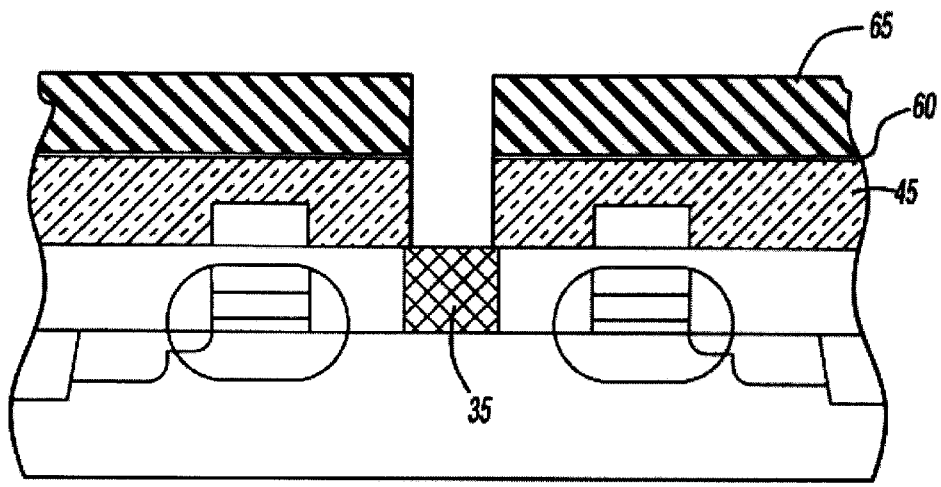
Figure 2H:
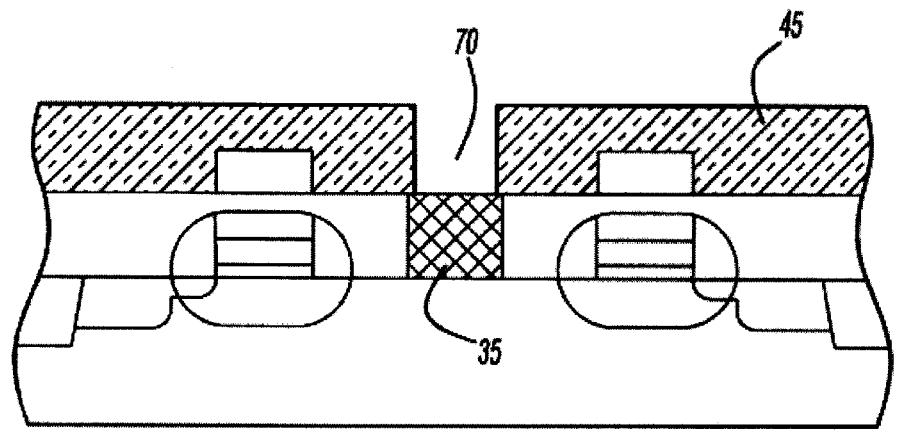

Referring to FIGS. 2G and 2H, a portion of the second interpoly dielectric layer 45 is secondly etched, using reactive ion etch (RIE) with $C_4F_8$, CO, and $O_2$ as an etchant gas mixture and using the polysilicon layer 65 as a hard mask, to expose the land pad, as shown in FIG. 2G. Next, the polysilicon layer 65 is removed, using eactive ion etch (RIE) with $Cl_2$ as an etchant, on the silicon nitride layer 60. Afterwards, the silicon nitride layer 60 is removed, using eactive ion etch (RIE) with $CHF_3$ as an etchant, on the second interpoly dielectric layer 45. Finally, the node contact hole 70 is formed a critical dimension about 0.1 μm in the second interpoly dielectric layer 45, as shown in FIG. 2H.

Although specific embodiments have been illustrated and described, it will be obvious to those skilled in the art that various modifications may be made without departing from the spirit which is intended to be limited solely by the appended claims.

What is claimed is:

1. A method of fabricating a node contact hole on a semiconductor substrate, said method comprising:
   forming a first interpoly dielectric (IPD1) layer over a semiconductor structure;
   forming a landing pad in said first interpoly dielectric layer;
   forming a polycide bit line on said first interpoly dielectric layer;
   forming a second interpoly dielectric (IPD2) layer on said polycide bit line, said landing pad, and said first interpoly dielectric layer;
   forming a defined photoresist layer on said second interpoly dielectric layer, said defined photoresist layer defining a node contact pattern;
   firstly etching a portion of said second interpoly dielectric layer using said defined photoresist layer as a mask;
   removing said defined photoresist layer;
   depositing a insulating layer on said second interpoly dielectric layer;
   depositing a polysilicon layer on said insulating layer;
   etching back said polysilicon layer to expose said insulating layer;
   secondly etching a portion of said second interpoly dielectric layer to expose said land pad, using said polysilicon layer as a hard mask;
   removing said polysilicon layer on said insulating layer;
   removing said insulating layer on said second interpoly dielectric layer; and
   forming said node contact hole in said second interpoly dielectric layer, said node contact hole having a critical dimension.

2. A method according to claim 1, wherein said semiconductor structure comprises a metal-oxide-semiconductor field effect transistor (MOSFET) formed in and on said semiconductor substrate.

3. A method according to claim 2, wherein said metal-oxide-semiconductor field effect transistor (MOSFET) comprises a shadow trench isolation (STI), a source/drain, a polycide word line, an oxide spacer, a thin oxide, and a cap oxide layer.

4. A method according to claim 1, wherein said first interpoly dielectric (IPD1) layer comprises a first silicon oxide, using low pressure chemical vapor deposition (LPCVD) procedures and tetraethylorthosilicate (TEOS) as a source, at a temperature between about 500.degree. to 800.degree. C., to a thickness between about 1000 to 3000 angstroms.

5. A method according to claim 1, wherein said landing pad comprises a polysilicon plug.

6. A method according to claim 1, wherein said polycide bit line comprises polysilicon and tungsten silicon ($WSi_2$).

7. A method according to claim 1, wherein said second interpoly dielectric (IPD2) layer comprises a second silicon oxide, using LPCVD procedures and TEOS as a source, at a temperature between about 500.degree. to 800.degree. C., to a thickness about 6000 angstroms.

8. A method according to claim 1, wherein said second interpoy dielectric layer is firstly etched, comprising reactive ion etch (RIE) procedures with an etchant gas mixture.

9. A method according to claim 8, wherein said etchant gas mixture comprises $C_4F_8$, CO, and $O_2$.

10. A method according to claim 1, wherein said insulating layer comprises silicon nitride ($Si_3N_4$), using LPCVD procedures, at a temperature about 750.degree. C., to a thickness about 86 angstroms.

11. A method according to claim 1, wherein said polysilicon layer is deposited, using LPCVD procedures and silane ($SiH_4$) as a source, at a temperature between about 600.degree. to 650.degree. C., to a thickness about 3000 angstroms.

12. A method according to claim 1, wherein said polysilicon layer is etched back, comprising reactive ion etch (RIE) procedures with $Cl_2$ as an etchant.

13. A method according to claim 1, wherein said polysilicon layer is etched back, comprising chemical mechanical polishing (CMP).

14. A method according to claim 1, wherein said second interpoy dielectric layer is secondly etched, comprising reactive ion etch (RIE) procedures with an etchant gas mixture.

15. A method according to claim 14, wherein said etchant gas mixture comprises $C_4F_8$, CO, and $O_2$.

16. A method according to claim 1, wherein said polysilicon layer is removed, comprises reactive ion etch (RIE) procedures with $Cl_2$ as an etchant.

17. A method according to claim 1, wherein said insulating layer is removed, comprises reactive ion etch (RIE) procedures with $CHF_3$ as an etchant.

18. A method according to claim 1, wherein said critical dimension is about 0.2 µm.

19. A method of fabricating a node contact hole on a semiconductor substrate, said method comprising:

forming a first interpoly dielectric (IPD1) layer over a semiconductor structure;

forming a landing pad in said first interpoly dielectric layer;

forming a polycide bit line on said first interpoly dielectric layer;

forming a second interpoly dielectric (IPD2) layer on said polycide bit line, said landing pad, and said first interpoly dielectric layer;

forming a defined photoresist layer on said second interpoly dielectric layer;

heating said defined photoresist layer, thereby forming a heated photoresist layer on said second interpoly dielectric layer, said heated photoresist layer defining a node contact pattern;

firstly etching a portion of said second interpoly dielectric layer using said heated photoresist layer as a mask;

forming a depth in said second interpoly dielectric layer;

removing said heated photoresist layer;

depositing a insulating layer on said second interpoly dielectric layer;

depositing a polysilicon layer on said insulating layer;

etching back said polysilicon layer to expose said insulating layer;

secondly etching a portion of said second interpoly dielectric layer to expose said land pad, using said polysilicon layer as a hard mask;

removing said polysilicon layer on said insulating layer;

removing said insulating layer on said second interpoly dielectric layer; and forming said node contact hole in said second interpoly dielectric layer, said node contact hole having a critical dimension.

20. A method according to claim 19, wherein said semiconductor structure comprises a metal-oxide-semiconductor field effect transistor (MOSFET) formed in and on said semiconductor substrate.

21. A method according to claim 20, wherein said metal-oxide-semiconductor field effect transistor (MOSFET) comprises a shadow trench isolation (STI), a source/drain, a polycide word line, an oxide spacer, a thin oxide, and a cap oxide layer.

22. A method according to claim 19, wherein said first interpoly dielectric (IPD1) layer comprises a first silicon oxide, using low pressure chemical vapor deposition (LPCVD) procedures and tetraethylorthosilicate (TEOS) as a source, at a temperature between about 500.degree. to 800.degree. C., to a thickness between about 1000 to 3000 angstroms.

23. A method according to claim 19, wherein said landing pad comprises a polysilicon plug.

24. A method according to claim 19, wherein said polycide bit line comprises polysilicon and tungsten silicon ($WSi_2$).

25. A method according to claim 19, wherein said second interpoly dielectric (IPD2) layer comprises a second silicon oxide, using LPCVD procedures and TEOS as a source, at a temperature between about 500.degree. to 800.degree. C., to a thickness about 6000 angstroms.

26. A method according to claim 19, wherein said heated photoresist layer is formed, comprising reflow and curing processes.

27. A method according to claim 19, wherein said second interpoly dielectric layer is firstly etched, comprising reactive ion etch (RIE) with an etchant gas mixture.

28. A method according to claim 27, wherein said etchant gas mixture comprises $C_4F_8$, CO, and $O_2$.

29. A method according to claim 19, wherein said depth is about 0.2 µm.

30. A method according to claim 19, wherein said insulating layer comprises silicon nitride ($Si_3N_4$), using LPCVD procedures, at a temperature about 750.degree. C., to a thickness about 86 angstroms.

31. A method according to claim 19, wherein said polysilicon layer is deposited, using LPCVD procedures and silane ($SiH_4$) as a source, at a temperature between about 600.degree. to 650.degree. C., to a thickness about 3000 angstroms.

32. A method according to claim 19, wherein said polysilicon layer is etched back, comprising reactive ion etch (RIE) procedures with $Cl_2$ as an etchant.

33. A method according to claim 19, wherein said polysilicon layer is etched back, comprising chemical mechanical polishing (CMP).

34. A method according to claim 19, wherein said second interpoy dielectric layer is secondly etched, comprising reactive ion etch (RIE) procedures with an etchant gas mixture.

35. A method according to claim 34, wherein said etchant gas mixture comprises $C_4F_8$, CO, and $O_2$.

36. A method according to claim 19, wherein said polysilicon layer is removed, comprises reactive ion etch (RIE) procedures with $Cl_2$ as an etchant.

37. A method according to claim 19, wherein said insulating layer is removed, comprises reactive ion etch (RIE) procedures with $CHF_3$ as an etchant.

38. A method according to claim 19, wherein said critical dimension is about 0.1 µm.

* * * * *